(12) United States Patent
Patil et al.

(10) Patent No.: US 10,971,455 B2
(45) Date of Patent: Apr. 6, 2021

(54) GROUND SHIELD PLANE FOR BALL GRID ARRAY (BGA) PACKAGE

(71) Applicant: QUALCOMM Incorporated, San Diego, CA (US)

(72) Inventors: Aniket Patil, San Diego, CA (US); Kuiwon Kang, San Diego, CA (US); Zhijie Wang, San Diego, CA (US); Ming Yi, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/400,264

(22) Filed: May 1, 2019

(65) Prior Publication Data
US 2020/0350260 A1 Nov. 5, 2020

(51) Int. Cl.
| | |
|---|---|
| *H01L 23/552* | (2006.01) |
| *H01L 23/04* | (2006.01) |
| *H01L 23/49* | (2006.01) |
| *H01L 23/498* | (2006.01) |
| *H01L 21/52* | (2006.01) |
| *H01L 23/556* | (2006.01) |

(52) U.S. Cl.
CPC ............ *H01L 23/552* (2013.01); *H01L 21/52* (2013.01); *H01L 23/04* (2013.01); *H01L 23/49822* (2013.01); *H01L 23/556* (2013.01)

(58) Field of Classification Search
CPC ..... H01L 23/552; H01L 23/556; H01L 23/04; H01L 23/49822
See application file for complete search history.

(56) References Cited

U.S. PATENT DOCUMENTS

| | | | |
|---|---|---|---|
| 7,339,199 B2* | 3/2008 | Lu | H01L 25/167 257/79 |
| 8,304,923 B2* | 11/2012 | Hu | H01L 21/6835 257/787 |
| 8,315,060 B2* | 11/2012 | Morikita | H01L 23/66 361/748 |
| 9,607,863 B1* | 3/2017 | Lee | H01L 25/50 |
| 10,068,832 B2* | 9/2018 | Han | H05K 7/2099 |
| 10,192,810 B2* | 1/2019 | Karhade | H01L 24/17 |
| 10,403,604 B2* | 9/2019 | Cheah | H01L 21/568 |
| 2004/0081833 A1* | 4/2004 | Zagdoun | C03C 17/36 428/432 |
| 2008/0157295 A1* | 7/2008 | Nuytkens | H05K 1/141 257/659 |
| 2010/0171200 A1* | 7/2010 | Lee | H01L 23/552 257/659 |
| 2010/0207258 A1* | 8/2010 | Eun | H01L 23/552 257/660 |
| 2012/0139089 A1* | 6/2012 | Huang | H01L 23/552 257/659 |
| 2013/0113089 A1* | 5/2013 | Huang | H01L 23/552 257/660 |

(Continued)

*Primary Examiner* — Ida M Soward
(74) *Attorney, Agent, or Firm* — Michelle S. Gallardo; Qualcomm Incorporated

(57) ABSTRACT

Certain aspects of the present disclosure provide an integrated circuit (IC) package and techniques for fabricating the IC package. The IC package generally includes a substrate, an IC disposed above the substrate, and a shielding layer coupled to a layer of the substrate, wherein the shielding layer is disposed above the substrate adjacent to the IC, and below an upper surface of the IC.

7 Claims, 10 Drawing Sheets

(56) References Cited

U.S. PATENT DOCUMENTS

| | | | |
|---|---|---|---|
| 2014/0146495 A1* | 5/2014 | Fisher, Jr. | H05K 9/0084 |
| | | | 361/753 |
| 2017/0301626 A1* | 10/2017 | Lee | H01L 23/5383 |
| 2019/0067163 A1* | 2/2019 | Qi | H01L 23/552 |
| 2019/0259634 A1* | 8/2019 | Wang | H01L 24/32 |
| 2020/0075818 A1* | 3/2020 | Pindl | H01L 33/50 |
| 2020/0279825 A1* | 9/2020 | Babcock | H01L 25/18 |
| 2020/0303321 A1* | 9/2020 | Murtuza | H01L 24/17 |

* cited by examiner

GROUND SHIELD PLANE FOR BALL GRID ARRAY (BGA) PACKAGE

FIELD OF THE DISCLOSURE

The present disclosure generally relates to an electrical module, and more particularly, to techniques and apparatus for electromagnetic shielding for the electrical module.

DESCRIPTION OF RELATED ART

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. For example, mobile electronic devices now commonly include multiple integrated circuit (IC) packages, allowing mobile device users to execute complex and power intensive software applications on their mobile devices.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are directed to an integrated circuit (IC) package and techniques for fabricating the same.

Certain aspects of the present disclosure are directed to an IC package. The IC package generally includes a substrate, an IC disposed above the substrate, and a shielding layer coupled to a layer of the substrate, wherein the shielding layer is disposed above the substrate. In certain aspects, the shielding layer is disposed adjacent to the IC and below an upper surface of the IC.

Certain aspects of the present disclosure are directed to a method for fabricating an IC package. The method generally includes supporting a shielding layer above a substrate and attaching an IC to the substrate such that the IC is disposed above the substrate. In certain aspects, the shielding layer is adjacent to and below an upper surface of the IC after attaching the IC to the substrate.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to an integrated circuit (IC) package and techniques for electromagnetic shielding of traces fanned out from an IC to a substrate of the IC package. For example, one or more shielding layers may be disposed above the substrate of the IC package and adjacent to the IC to provide the electromagnetic shielding.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
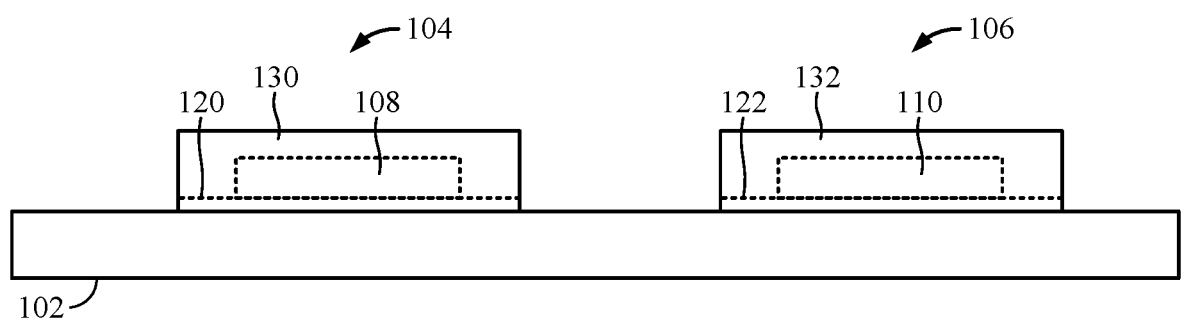
FIG. 1 illustrates a printed circuit board (PCB) on which one or more integrated circuit (IC) packages may be disposed, in accordance with certain aspects of the present disclosure.

FIG. 1 illustrates a printed circuit board (PCB) 102 on which one or more integrated circuit (IC) packages may be disposed, in accordance with certain aspects of the present disclosure. For example, IC packages 104, 106 may be soldered on the PCB 102. Each of the IC packages 104, 106 may include an IC 108, 110 (also referred to as a "die" or "chip"), where the ICs 108, 110 are housed by respective lids 130, 132. Each of the IC packages 104, 106 may be implemented as a flip-chip (FC) ball-grid array (BGA) package. A ball grid array (BGA) is a type of surface-mount packaging to house at least one IC, and electrically couple the IC to the PCB 102 using surface mount technology via an array of solder balls disposed at the bottom surface of the BGA package. Each IC 108, 110 may be electrically coupled to a substrate 120, 122 (e.g., laminate substrates) of the IC package 104, 106. For example, the solder bumps of the IC 108 may be attached to solder bumps of the substrate 120, and fanned out via traces on the first layer (e.g., also referred to as "die attach layer" or "M1 layer") of the substrate 120 for electrical connection to different metal layers of the substrate and/or to solder bumps below the IC package 104 connected to the PCB 102.

The traces in the substrate 120 may be shielded via ground layers in the substrate 120. However, currently there is no stack-up technology to allow for double-sided shielding for the signals which are fanned out in the first metal layer of the substrate. Rather, signal routing in the first metal layer (M1 layer) may be only shielded by one ground plane in the metal layer (e.g., M2 layer) below the M1 layer.

Certain aspects of the present disclosure provide a shielding layer to shield signals in the M1 layer from the top side, in addition to the bottom side shielded via the M2 layer. For example, a shielding layer (also referred to as an "M0 layer" or "shielding plane") may be disposed above the M1 layer, as described in more detail herein. The shielding layer may comprise metal (e.g., Cu), which may be the same metal or a different metal than that of the M1 layer. The shielding layer may be implemented without changing the substrate stack-up or increasing the heights of the IC packages 104, 106. The shielding layer may be attached using a pick-and-place methodology with vias for the shielding layer acting as interconnect terminals to connect the shielding layer and the M1 layer.

Figure 2A:
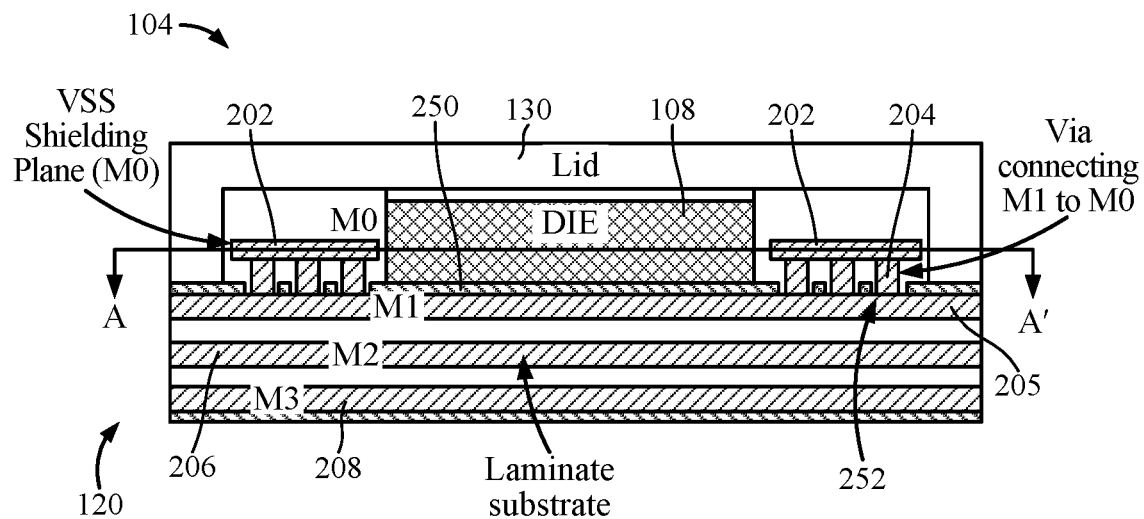
FIGS. 2A and 2B illustrate a cross-section and plan view of an example IC package, in accordance with certain aspects of the present disclosure.
Figure 2B:
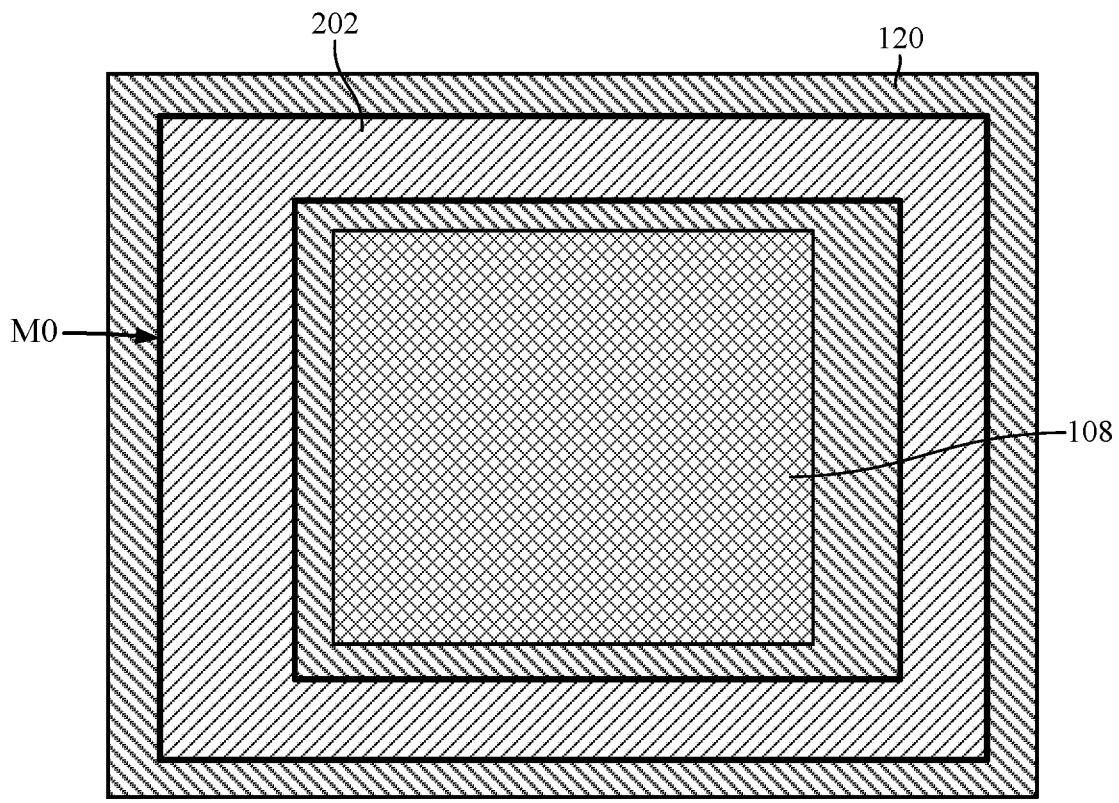

FIGS. 2A and 2B illustrate a cross-section and plan view of an example IC package 104, in accordance with certain aspects of the present disclosure. FIG. 2B is a cross-section taken through line A-A' in FIG. 2A. As illustrated, the substrate 120 includes an M1 layer 205, M2 layer 206, and an M3 layer 208, which may be separated by electrically insulative (e.g., dielectric) layers. For certain aspects, the substrate 120 may include more or less than three metal layers. In certain aspects, the shielding layer 202 may surround the periphery of the IC 108 (e.g., may completely or partially encircle the lateral surfaces of the IC). Moreover, the shielding layer 202 may be disposed above the M1 layer 205 to shield the signals of electrical conductors (e.g., traces and vias) in the substrate 120, particularly of conductors in the M1 layer. At least one via 204 may be used to couple the shielding layer 202 to the M1 layer 205. For instance, a solder resist opening (SRO) 252 may be formed in the solder resist 250 to allow for the soldering of the via 204 to the M1 layer, as illustrated. The shielding layer 202 may be grounded through the substrate (e.g., M1 layer). In other words, the shielding layer 202 may be coupled to a ground plane of the substrate 120. For certain aspects, this ground plane may be located on the M2 layer.

Figure 3:
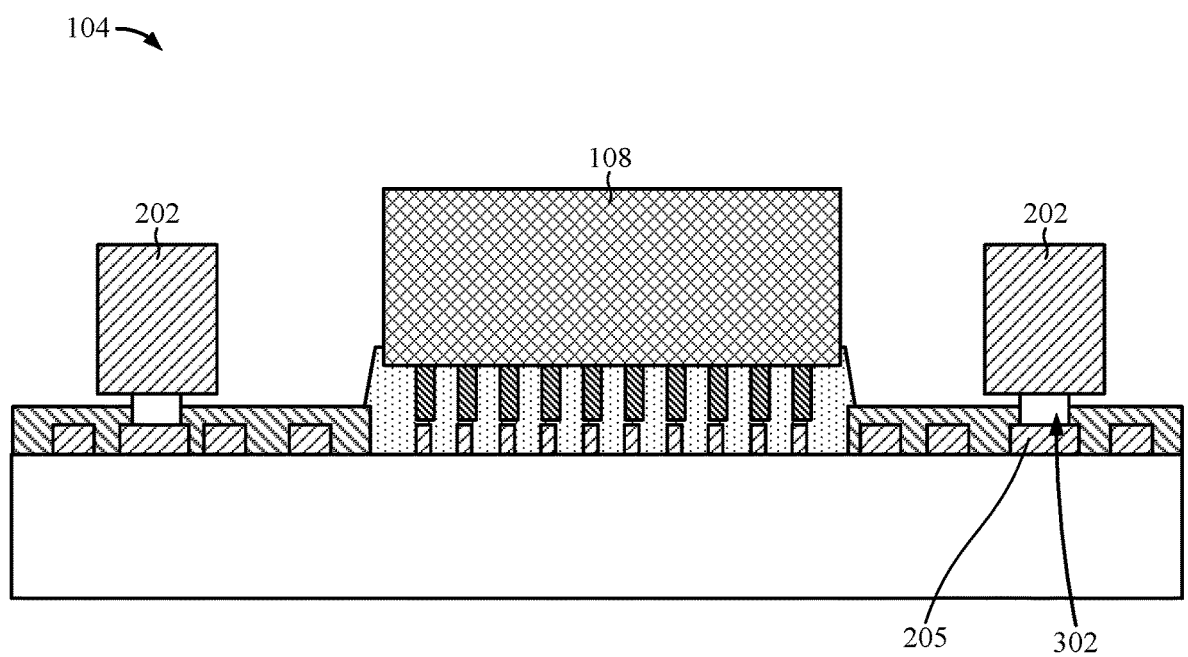
FIG. 3 illustrates a cross-sectional view of the example IC package, in accordance with certain aspects of the present disclosure.

FIG. 3 illustrates a cross-sectional view of the example IC package 104, in accordance with certain aspects of the present disclosure. As illustrated, the shielding layer 202 (e.g., a copper (Cu) block) may be coupled to traces of the M1 layer 205 though an SRO via solder 302. The shielding layer 202 may be attached to the M1 layer 205 using a chip attachment placement procedure, such as a surface mount technology (SMT) process.

Figure 4:
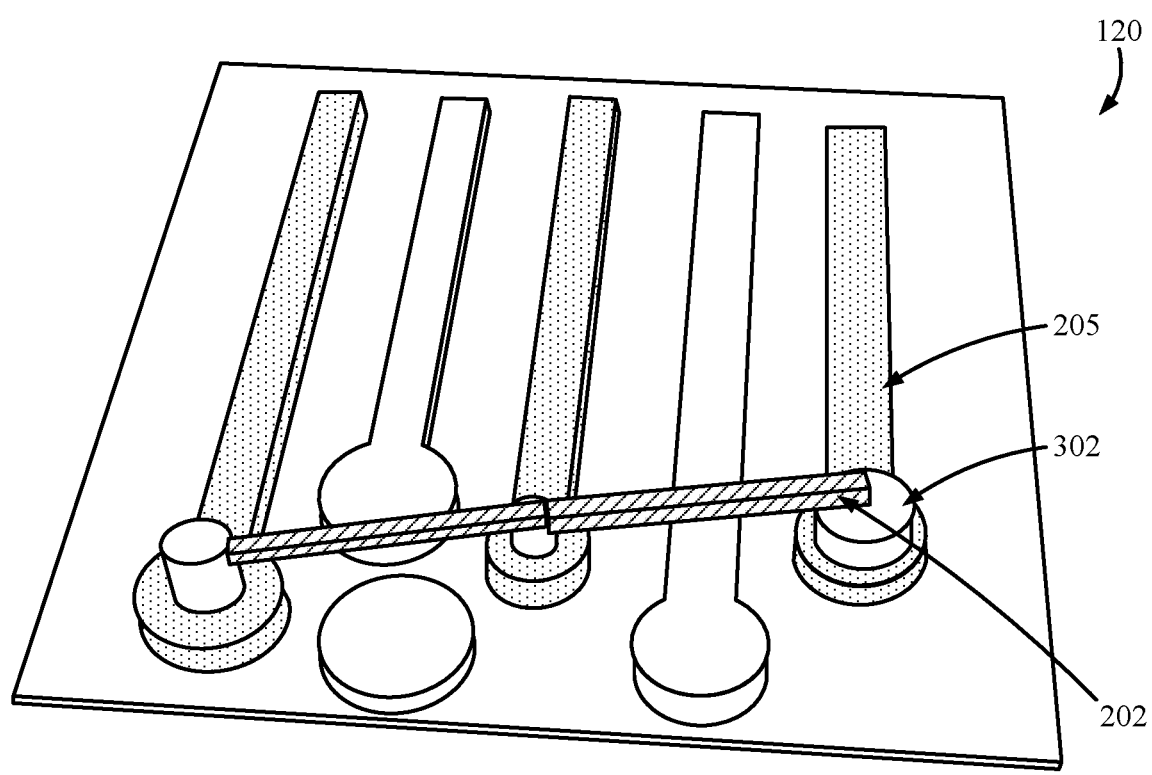
FIG. 4 is a perspective view of a shielding layer coupled to a layer of a substrate, in accordance with certain aspects of the present disclosure.

FIG. 4 is a perspective view of the shielding layer 202, in accordance with certain aspects of the present disclosure. As illustrated, the shielding layer 202 is coupled to traces of the M1 layer 205. For example, the shielding layer 202 may be a Cu block, coupled to the traces of the M1 layer 205 via the solder 302 to facilitate electromagnetic shielding of other traces of the substrate 120, as described herein.

Figure 5:
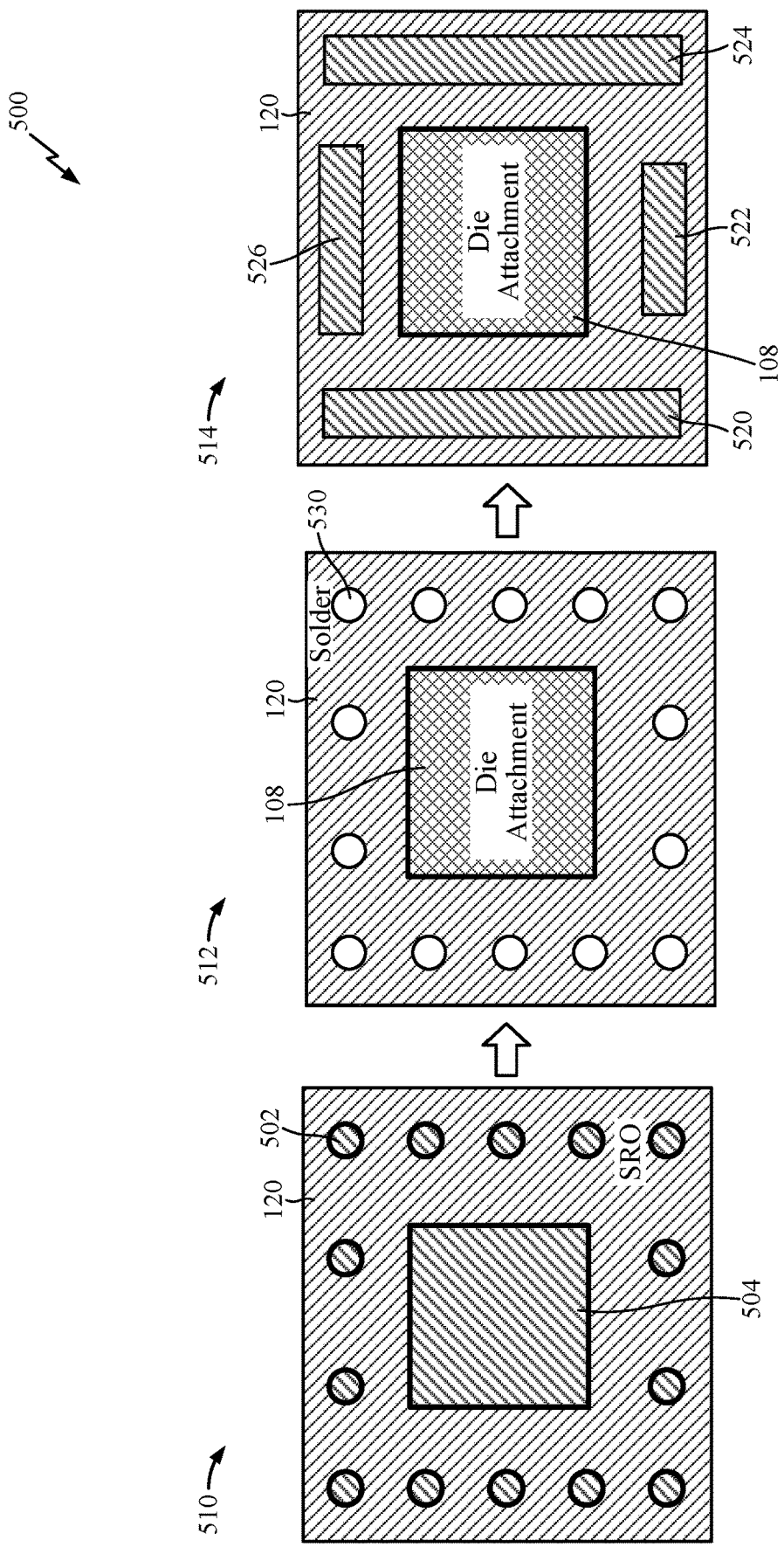
FIG. 5 illustrates an example IC package during different fabrication stages, in accordance with certain aspects of the present disclosure.

FIG. 5 illustrates an example IC package 500 during different fabrication stages 510, 512, 514, in accordance with certain aspects of the present disclosure. At the fabrication stage 510, the substrate 120 includes a plurality of SROs in the solder resist layer. For example, the substrate 120 may include an SRO 502 for soldering a shielding layer to the substrate 120 and an SRO 504 for soldering an IC to the substrate 120. At fabrication stage 512, solder paste 530 may be disposed in each of the SROs. As illustrated, the IC 108 may be soldered to the substrate 120. At fabrication 514, one or more components 520, 522, 524, 526 of the shielding layer may be disposed on the substrate 120 and soldered to the substrate 120 after a solder reflow process. Each of the components 520, 522, 524, 526 may be disposed adjacent to a different side of the IC 108 to facilitate electromagnetic shielding as described herein. For other aspects, the shielding layer may comprise a single component surrounding the various lateral surfaces of the IC.

Figure 6:
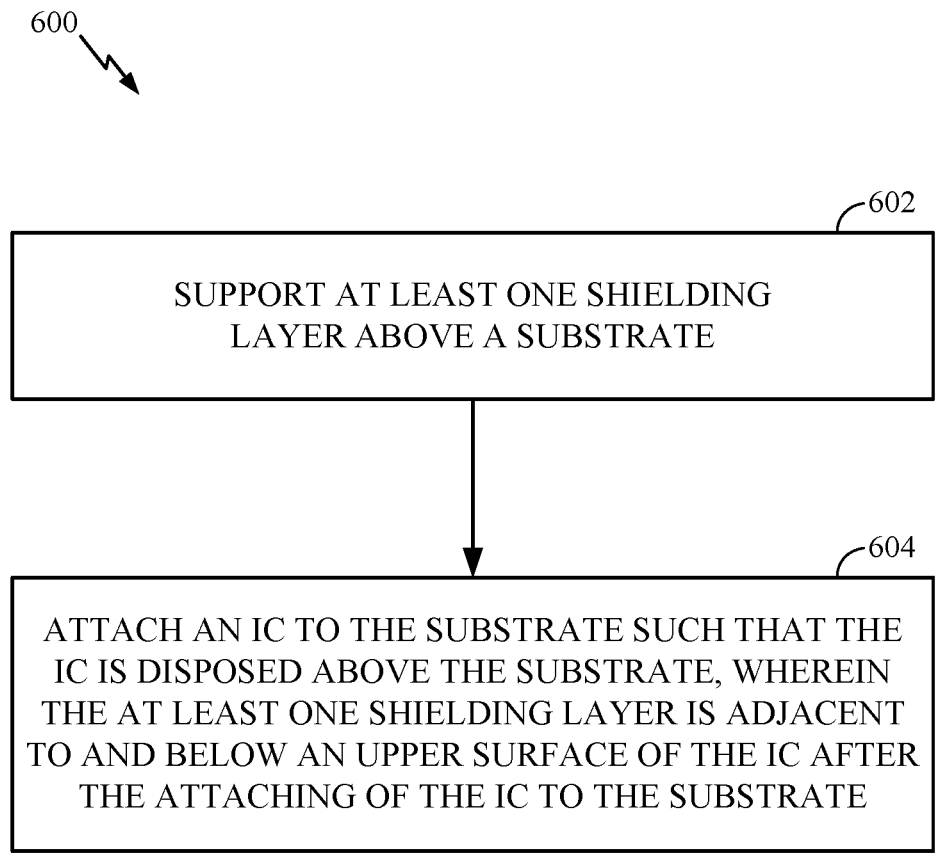
FIG. 6 is a flow diagram illustrating example operations for fabricating an IC package, in accordance with certain aspects of the present disclosure.

FIG. 6 is a flow diagram illustrating example operations 600 for fabricating an IC package, in accordance with certain aspects of the present disclosure. The operations 600 may be performed, for example, by a fabrication facility.

The operations 600 may begin, at block 602, with the fabrication facility supporting at least one shielding layer above a substrate (e.g., substrate 120). For example, the fabrication facility may form at least one solder resist opening (e.g., SRO 502) on the substrate, wherein supporting the at least one shielding layer comprises attaching the at least one shielding layer to the substrate via the solder resist opening. At block 604, the fabrication facility may attach an IC to the substrate such that the IC is disposed above the substrate. In certain aspects, the at least one shielding layer may be adjacent to and below an upper surface of the IC after the attaching of the IC to the substrate.

In certain aspects, the at least one shielding layer is formed after the IC is soldered on the substrate. For example, the IC may be attached on the substrate, followed by the pick and place of the at least one shielding layer on the substrate, and a mass reflow process. In other aspects, the IC may be soldered on the substrate after the at least one shielding layer is soldered or disposed above the substrate. For example, attaching the at least one shielding layer may involve pick and place of the at least one shielding layer, followed by a solder reflow process. The IC may then be attached on the substrate via a mass reflow process or flip chip attach operation.

In certain aspects, the at least one shielding layer comprises a single shielding layer (e.g., shielding layer 202) surrounding the IC above the substrate. In certain aspects, the at least one shielding layer comprises a plurality of shielding components (e.g., components 520, 522, 524, 526), each of the plurality of shielding components being adjacent to a different side of the IC.

In certain aspects, the soldering of the at least one shielding layer includes soldering at least one via to the layer of the substrate, the at least one via being coupled to the at least one shielding layer. In certain aspects, the at least one shielding layer comprises at least one metal layer. In certain aspects, the operations 600 also include disposing a lid (e.g., lid 130) above the IC.

Figure 7A:
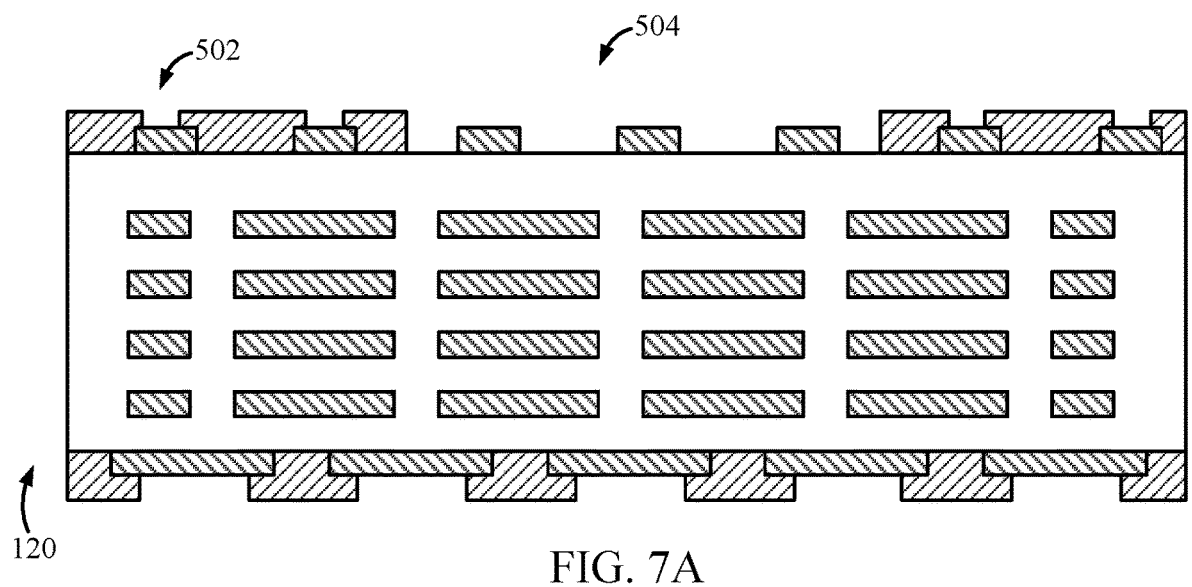
FIGS. 7A, 7B, 8A, 8B, 9A, 9B, 10A, and 10B illustrate example operations for fabricating an IC package, in accordance with certain aspects of the present disclosure.
Figure 7B:
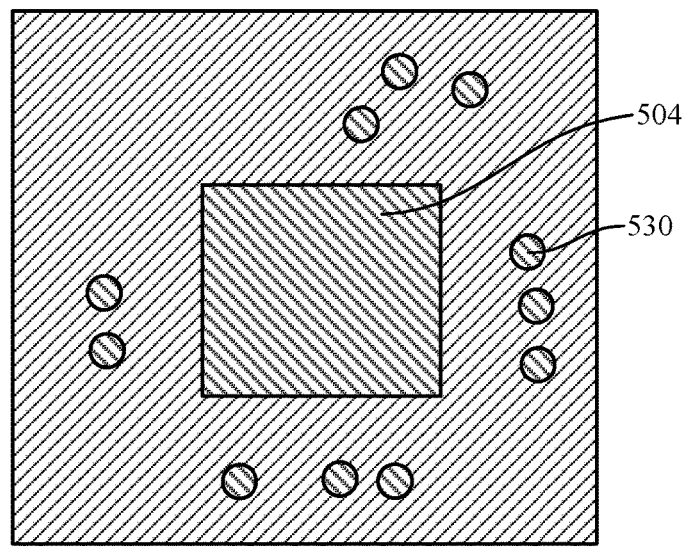
Figure 8A:
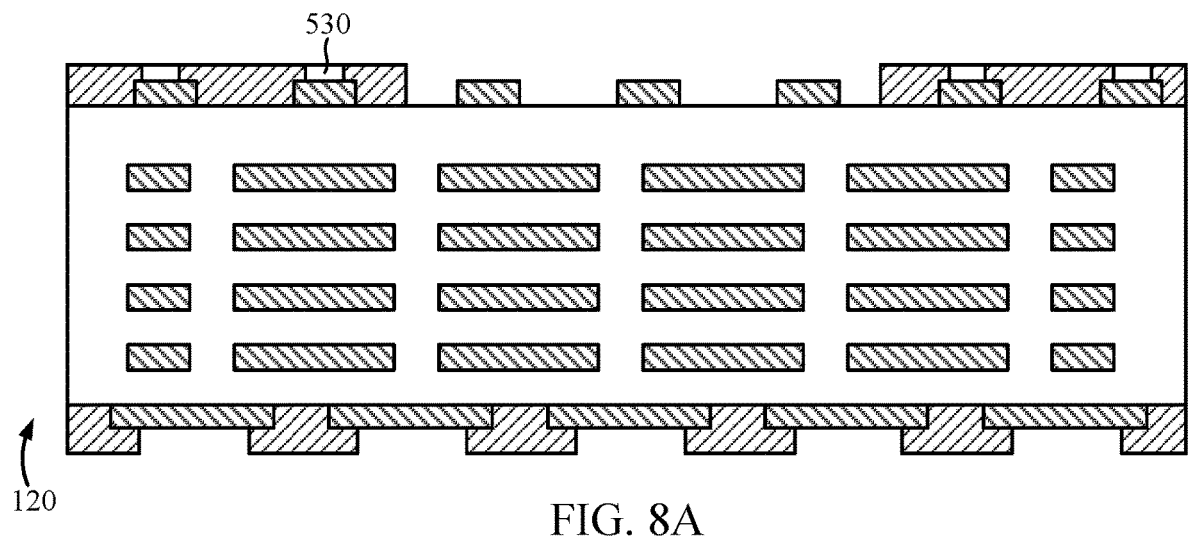
Figure 8B:
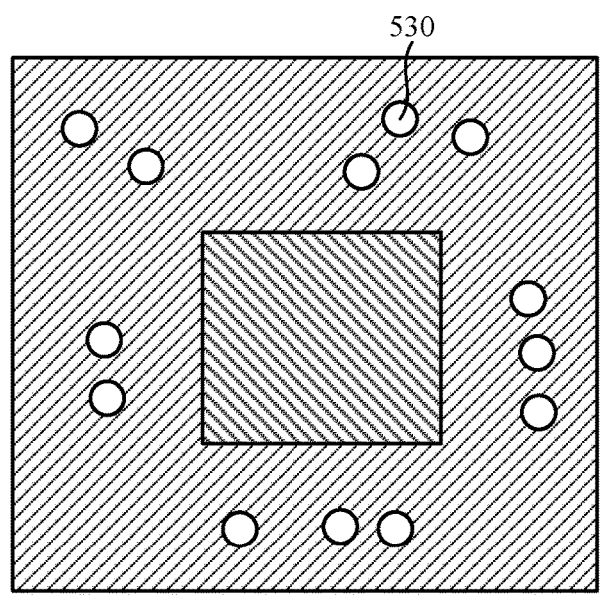

FIGS. 7A, 7B, 8A, 8B, 9A, 9B, 10A, and 10B illustrate example operations for fabricating an IC package, in accordance with certain aspects of the present disclosure. FIG. 7A is a cross-sectional view of the IC package during a first fabrication step, and FIG. 7B is a top view of the IC packet during the first fabrication step. As illustrated in FIGS. 7A and 7B, the substrate 120 includes a plurality of SROs in the solder resist layer. For example, the substrate 120 may include an SRO 502 for soldering a shielding layer to the substrate 120 and an SRO 504 for soldering an IC to the substrate 120. FIG. 8A is a cross-sectional view of the IC package during a second fabrication step, and FIG. 8B is a top view of the IC packet during the second fabrication step. As illustrated in FIGS. 8A and 8B, solder paste 530 may be disposed in each of the SROs.

Figure 9A:
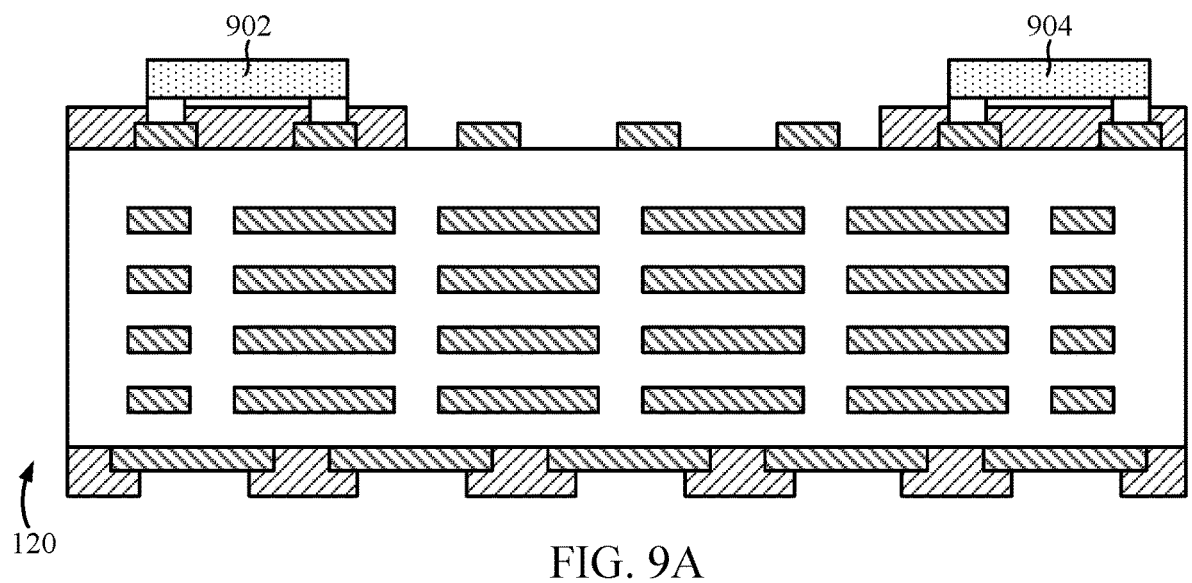
Figure 9B:
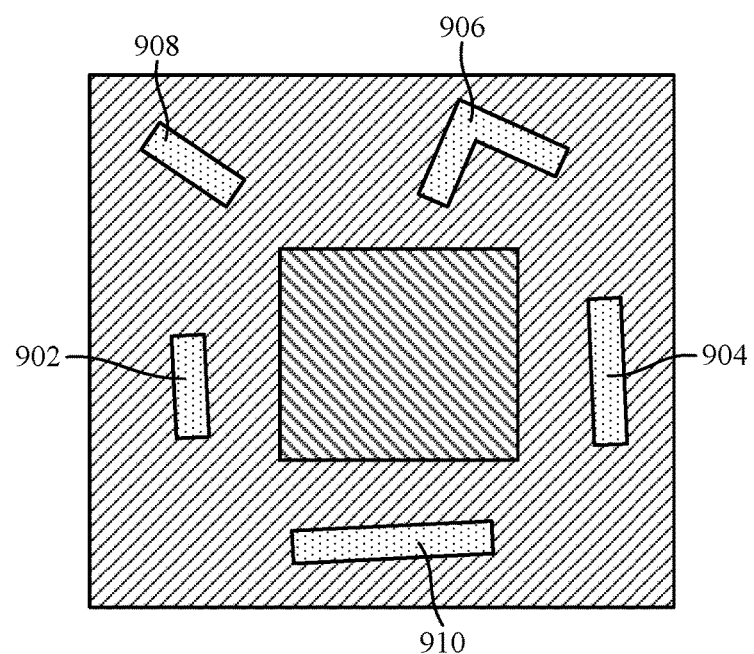
Figure 10A:
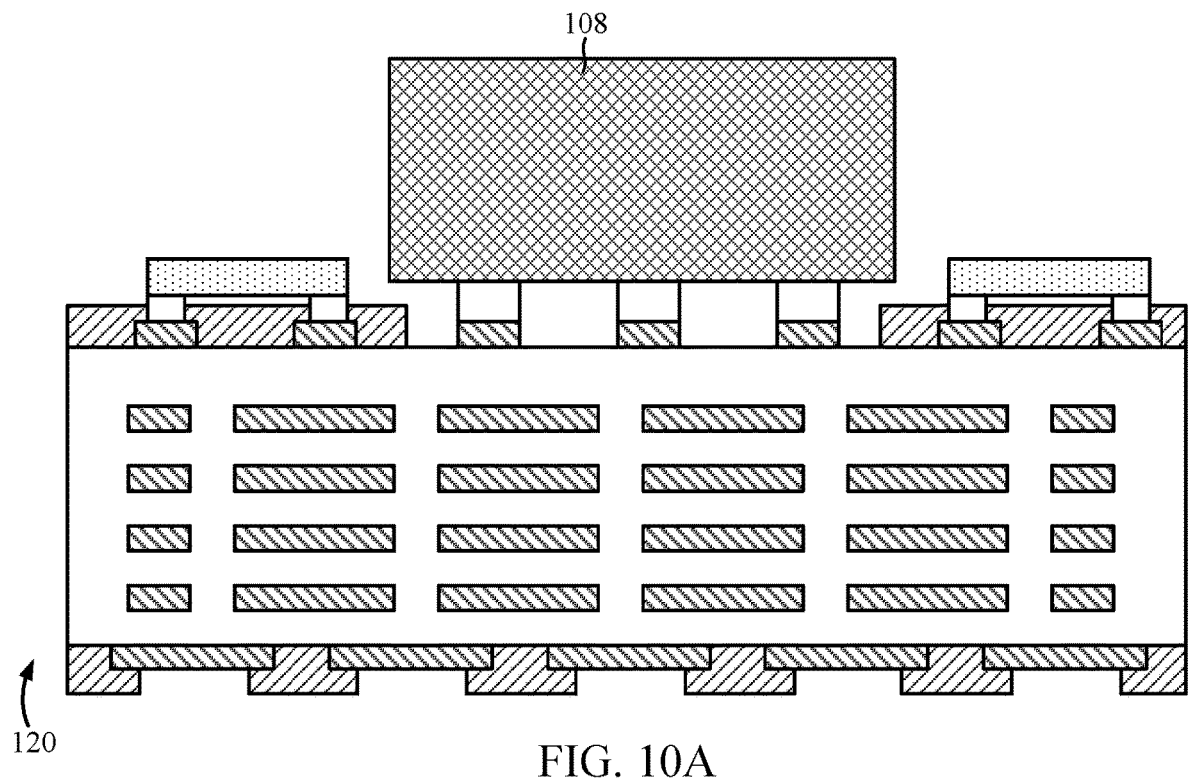
Figure 10B:
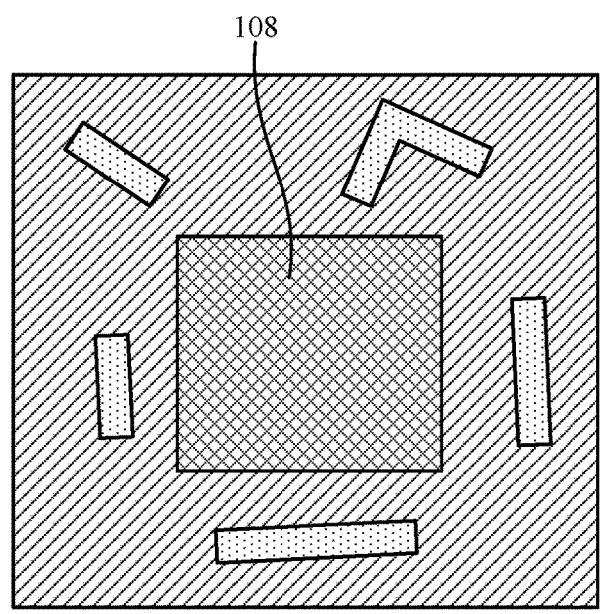

FIG. 9A is a cross-sectional view of the IC package during a third fabrication step, and FIG. 9B is a top view of the IC packet during the third fabrication step. As illustrated in FIGS. 9A and 9B, one or more components 902, 904, 906, 908, 910 of the shielding layer may be disposed on the substrate 120 and soldered to the substrate 120 after a solder reflow process. FIG. 10A is a cross-sectional view of the IC package during a third fabrication step, and FIG. 10B is a top down view of the IC packet during the third fabrication step. As illustrated in FIGS. 10A and 10B, the IC 108 may be soldered to the substrate 120.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features and/or functions illustrated herein may be rearranged and/or combined into a single component, step, feature or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

These apparatus and methods are described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

What is claimed is:

1. An integrated circuit (IC) package, comprising:
   a substrate;
   an IC disposed above the substrate; and
   a shielding layer coupled to a layer of the substrate via a support element configured to support the shielding layer above the substrate such that the shielding layer is disposed at a lateral side of the IC and with a height of an upper surface of the shielding layer above the substrate being lower than a height of an upper surface of the IC above the substrate.

2. The IC package of claim 1, wherein the shielding layer completely surrounds lateral surfaces of the IC above the substrate.

3. The IC package of claim 1, wherein the shielding layer comprises a plurality of shielding components, each of the plurality of shielding components being disposed adjacent to a different side of the IC.

4. The IC package of claim 1, wherein the support element is at least one via coupled to the shielding layer and soldered to the layer of the substrate.

5. The IC package of claim 1, wherein the shielding layer is grounded via the layer of the substrate.

6. The IC package of claim 1, wherein the shielding layer comprises at least one metal layer.

7. The IC package of claim 1, further comprising a lid disposed above the IC.

\* \* \* \* \*